United States Patent [19]

Morokawa et al.

[11] 4,045,692
[45] Aug. 30, 1977

[54] SOLID STATE BINARY LOGIC SIGNAL SOURCE FOR ELECTRONIC TIMEPIECE OR THE LIKE

[76] Inventors: Shigeru Morokawa, No. 325-43, Narahashi, Higashiyamato, Tokyo; Fukuo Sekiya, No. 28-206-103, 4-chome, Midori-cho, Tokorozawa, both of Japan

[21] Appl. No.: 615,850

[22] Filed: Sept. 23, 1975

[30] Foreign Application Priority Data

Sept. 30, 1974 Japan .................................. 49-112592

[51] Int. Cl.$^2$ .................... H03K 3/353; H03K 3/286; H03K 17/04; G04C 3/00
[52] U.S. Cl. .................................. 307/279; 58/23 A; 58/50 R; 307/200 B; 307/247 A; 307/251
[58] Field of Search ............... 307/205, 214, 279, 270, 307/200 B, 247 A; 58/23 A, 23 BA, 23 D; 330/35

[56] References Cited

U.S. PATENT DOCUMENTS

| | | | |
|---|---|---|---|
| 3,562,559 | 2/1971 | Rapp | 307/279 |
| 3,675,144 | 7/1972 | Zuk | 330/35 X |
| 3,728,556 | 4/1973 | Arnell | 307/279 X |
| 3,753,009 | 8/1973 | Clapper | 307/279 |
| 3,755,690 | 8/1973 | Smith | 307/205 |
| 3,823,330 | 7/1974 | Rapp | 307/205 X |
| 3,904,888 | 9/1975 | Griffin et al. | 307/205 |
| 3,911,289 | 10/1975 | Takemoto | 307/205 |
| 3,921,010 | 11/1975 | Griffin | 307/205 X |
| 3,922,647 | 11/1975 | Broeker, Jr. | 307/279 X |

OTHER PUBLICATIONS

LEEHAN, "Low Power CMOS OFF-CHIP DRIVER-RECEIVER CIRCUITRY," IBM Tech. Discl. Bull.; vol. 16, No. 7, Dec. 1973, pp. 2315-2316.
CHIN, "FET POLARITY HOLD CIRCUIT;" IBM Tech. Discl. Bull.; vol. 15, No. 6, pp. 1757-1758, Nov. 1972.
CHRISTOPHERSON, "FET HYSTERESIS CIRCUIT;" IBM Tech. Discl. Bull.; vol. 15, No. 5, pp. 1475-1476, Oct. 1972.
CRAWFORD et al., "FET CONDUCTANCE MULTIPLIERS," Instruments and Control Systems (pub.) Sept. 1970, vol. 3, No. 9, pp. 117-119.

Primary Examiner—John S. Heyman
Assistant Examiner—Larry N. Anagnos
Attorney, Agent, or Firm—Holman & Stern

[57] ABSTRACT

An inverting amplifier is provided with a high impedance input resistor connected at one end to an input terminal of the amplifier and connected at the other end to a first voltage source constituting a first binary logic level. The input terminal is also connected through a switch to a second voltage source constituting a second and opposite binary level. An MOS-FET has source and drain electrodes connected to the input terminal and the first voltage source respectively and a gate electrode connected to an output terminal of the amplifier. When the switch is closed, the second voltage is applied to the input terminal and the inverted output of the amplifier turns off the MOS-FET. When the switch is open, the first voltage is applied to the input terminal through the resistor and the inverted output of the amplifier turns on the MOS-FET. The low impedance of the MOS-FET in the turned on condition increases the stability of the amplifier under high humidity conditions.

3 Claims, 5 Drawing Figures

SOLID STATE BINARY LOGIC SIGNAL SOURCE FOR ELECTRONIC TIMEPIECE OR THE LIKE

The present invention relates to a solid state binary logic signal source for an electronic timepiece or the like which provides one or another of two binary voltage logic levels in a stable manner under high humidity conditions.

A prior art circuit to which the present invention is an improvement comprises a metal oxide semiconductor inverting amplifier having a high impedance input resistor connected between an input terminal thereof and a first voltage source. A switch is connected between the input terminal and a second voltage source. When the switch is closed, the second voltage is applied to the input terminal, and when the switch is open the first voltage is applied to the input terminal across the input resistor. The output voltage of the amplifier is the inverse of the input voltage, and is fed to an electronic device such as an electronic timepiece. The output of the amplifier may be utilized as a reset input to the electronic timepiece to stop the counting operation thereof or stop the movement of a second-hand, to advance the hour, minute or second setting or other similar functions. The device of the present invention is also applicable to electronic calculators, especially battery powered models, or any other type of electronic device in which one of two binary logic level voltages is required in response to actuating a switch.

The prior art circuit described above suffers from a drawback, especially in an application such as an electronic timepiece which must operate with minimum battery consumption, in that the input resistor must have a very high impedance in order to limit the current flow therethrough to a very small value when the switch is closed. Where the amplifier is a CMOS inverter, such an input configuration comprising a high impedance input resistor becomes unstable under high humidity conditions, with the result that the electronic timepiece may malfunction or become inaccurate.

It is therefore an important object of the present invention to provide a solid state binary logic signal source for an electronic timepiece or the like which comprises variable impedance means in the form of an MOS-FET to provide a low input impedance to the CMOS inverting amplifier to stabilize the same under high humidity conditions when a switch connected to an input of the amplifier is open.

The above and other objects, features and advantages of the present invention will become clear from the following detailed description taken with the accompanying drawings, in which.

Figure 1:
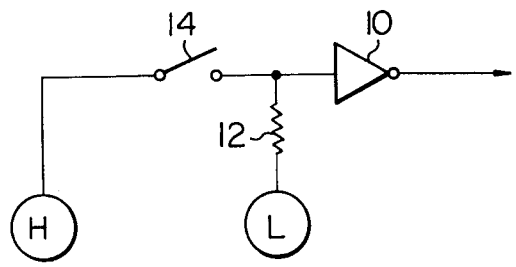
FIG. 1 is a schematic circuit diagram of a prior art circuit to which the present invention is an improvement.

Referring first to FIG. 1, a prior art logic signal source comprises a complementary metal oxide semiconductor (CMOS) inverting amplifier 10, the input of which is connected through a high impedance input resistor 12 to a low voltage source L which constitutes a low logic voltage level. The input of the amplifier 10 is also connected through a switch 14 to a high voltage source H which constitutes a high logic voltage level. In operation, when the switch 14 is open the low voltage L is applied to the input of the amplifier 10 and a high voltage which is preferably equal to H appears at the output of the amplifier 10. When the switch 14 is closed, the high voltage H is applied to the input of the amplifier 10 so that a low voltage which is preferably equal to L appears at the output of the amplifier 10.

This prior art device suffers from the drawback that the input circuit thereof comprising the high impedance input resistor 12 is unstable when the switch 14 is open and the ambient humidity is high.

Figure 2:
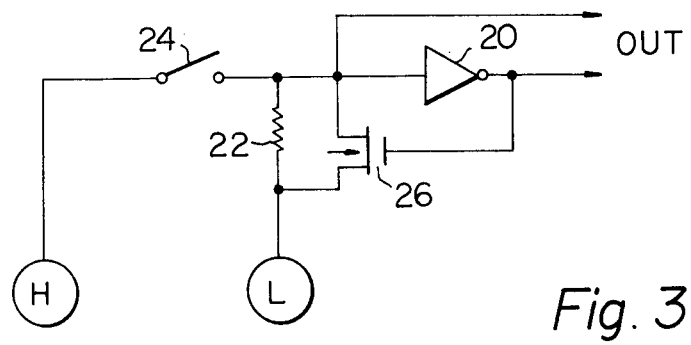
FIG. 2 is a schematic circuit diagram of a first embodiment of a logic signal source according to the present invention.

This problem is overcome in the embodiment of the present invention in FIG. 2. An inverting amplifier 20 is identical to the amplifier 10 and is connected to a high impedance input resistor 22 and a switch 24 in the same manner as in FIG. 1. However, the device of FIG. 2 further comprises, in combination, a metal oxide semiconductor field effect transistor (MOS-FET) 26 of the n-channel type which serves as a variable impedance means. The source of the transistor 26 is connected to the input of the amplifier 20 and the drain thereof is connected to the low voltage L in such a manner that the channel of the transistor 26 is connected between the input of the amplifier 20 and the low voltage L. The gate of the transistor 26 is connected to the output of the amplifier 20. The transistor 26 and the amplifier 20 are arranged in such a manner that the DC voltage loop gain thereof is greater than unity.

The basic operation of the device of FIG. 2 is identical to that of the device of FIG. 1. However, the transistor 26 serves to provide a low impedance path between the input of the amplifier 20 and the low voltage L when the switch 24 is open to provide a highly stable input circuit arrangement for the amplifier 20.

When the switch 24 is closed, the high voltage H is applied to the input of the amplifier 20 so that a low voltage appears at the output thereof. This low voltage output of the amplifier 20 is applied to the gate of the transistor 26 which causes the transistor 26 to turn off. Since the channel impedance of the transistor 26 is extremely high in the turned off condition, the transistor 26 has no effect on the amplifier 20.

However, when the switch 24 is open, the low voltage L is applied to the input of the amplifier 20 which produces a high output. This high output turns on the transistor 26 so that the channel impedance of the transistor 26 becomes extremely low, providing a low impedance path between the input of the amplifier 20 and the low voltage L. The low voltage L is therefore applied to the input of the amplifier 20 through the transistor 26 rather than the resistor 22, resulting in a stable input circuit configuration which is uneffected by variations in humidity.

Useful outputs can be taken either from the input or the output of the amplifier 20 as indicated by arrows in FIG. 2 as required for the various operations of the electronic timepiece or the like.

Figure 3:
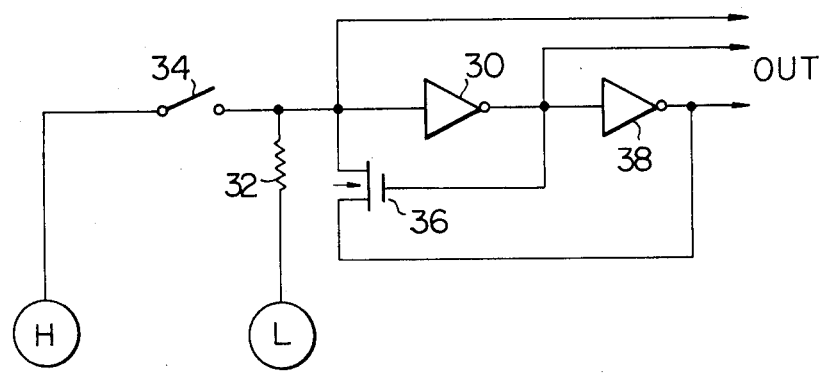
FIG. 3 is a schematic diagram of a second embodiment of the invention.

FIG. 3 is identical to FIG. 2 in that an inverting amplifier 30 is connected to an input resistor 32 and a switch 34 in the same manner. The output of the amplifier 30 is connected to an input of a second inverting amplifier 38 which is identical to the amplifier 30. A transistor 36 identical to the transistor 26 similarly has its source connected to the input of the amplifier 30 and its gate connected to the output of the amplifier 30. However, the drain of the transistor 36 is connected to the output of the amplifier 38.

The operation of the embodiment of FIG. 3 is identical to that of FIG. 2 with the addition that the inverting amplifier 38 will invert the output of the amplifier 30 so that the output of the amplifier 38 will be of the same logic level as the input of the amplifier 30. When the switch 34 is open, the amplifier 38 will produce a low voltage output which is applied to the drain of the transistor 36, the output of the amplifier 38 in this case constituting a low voltage source. Since the output of the amplifier 30 is high when the switch 34 is open, the transistor 36 will be turned on and the input of the amplifier 30 will be connected to a low voltage source through a low impedance path in the desired manner. Useful outputs can be obtained from the input of the amplifier 30 and the outputs of the amplifiers 30 and 38.

Figure 4:
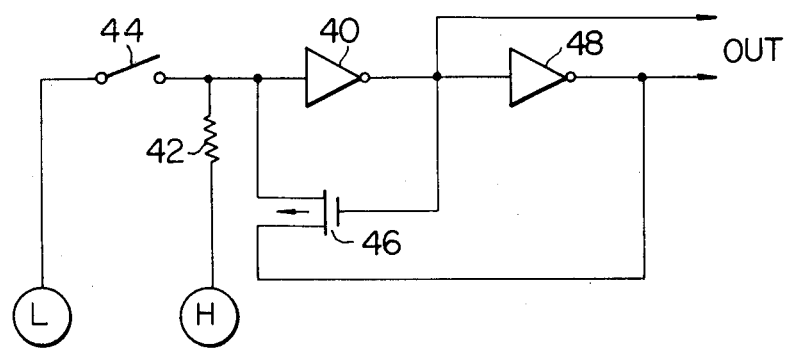
FIG. 4 is a schematic diagram of a third embodiment of the invention.

FIG. 4 is identical to FIG. 3 in that amplifiers 40 and 48, an input resistor 42, a transistor 46 and a switch 44 are provided in essentially the same manner as in FIG. 3. The only difference is that the high and low voltage sources H and L are exchanged and the channel connections of the transistor 46 are reversed. Useful outputs can be obtained from the outputs of the amplifiers 40 and 48.

Figure 5:
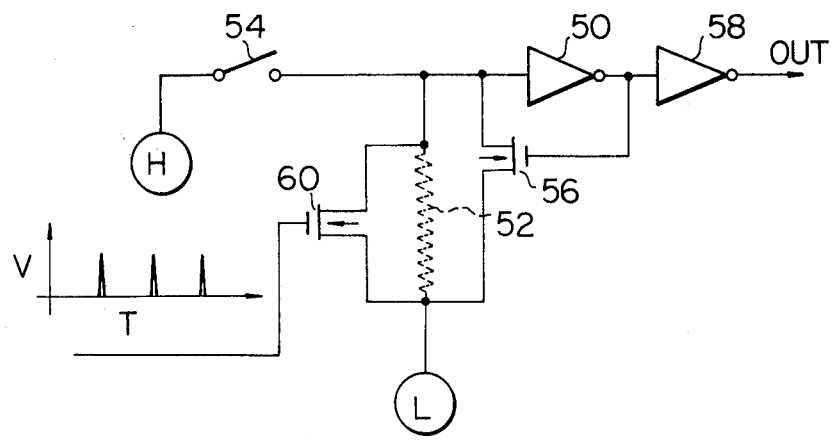
FIG. 5 is a schematic diagram of a fourth embodiment of the invention.

The embodiment of FIG. 5 is identical to that of FIG. 2 in that an amplifier 50, a transistor 56, an input resistor 52 and a switch 54 are provided in essentially the same manner. The embodiment of FIG. 5, however, comprises a second inverting amplifier 58 identical to the amplifier 50 and having its input connected to the output of the amplifier 50, and a second transistor 60 of the n-channel type which is connected between the input of the amplifier 50 and a low voltage source L in parallel to the resistor 52. The gate of the second transistor 60 is adapted to receive positive clock pulses which vary in voltage (V) and time (T) as indicated in FIG. 5.

The basic operation of the device of FIG. 5 is identical to that of the device of FIG. 2 except that the transistor 60 is turned on by the clock pulses. It should be understood that the resistance offered by the inverter 50 to the current flowing therethrough is preferably much lower than that of the conducting path of the transistor 60 when in the conductive state or the width of the clock pulse to be applied to the gate of the transistor 60 is selected to be as small as possible.

It will become clear to those skilled in the art that many modifications are possible within the scope of the present disclosure to the specific embodiments shown and described. The various polarities of the components may be suitably changed, and various component substitutions may be made. For example, the amplifier 20 may be non-inverting if the transistor 26 is provided with an inverting input. The amplifier 20 may be other than a CMOS amplifier and the transistor 26 may be other than an FET as long as it serves the function of a variable impedance means.

What is claimed is:

1. A solid state binary logic signal source for an electronic timepiece comprising:
   a first voltage source;
   a second voltage source;
   an input resistor connected to said first voltage source;
   a normally open switch connected to said second voltage source;
   a first inverting amplifier having an input terminal connected to
      said first and second voltage sources through said input resistor and said normally open switch, respectively, and an output terminal at which a first voltage equal to that of said second voltage source appears when said switch is open and a second voltage equal to that of said first voltage source appears when said switch is closed;
   a second inverting amplifier having an input terminal connected to the output terminal of said first inverting amplifier and an output terminal; and
   a field effect transistor connected between the input terminal of said first inverting amplifier and the output terminal of said second inverting amplifier and having a gate electrode connected to the output terminal of said first inverting amplifier, said field effect transistor being normally turned on in response to said first voltage appearing at the output terminal of said first inverting amplifier to provide a low impedance path between the input terminal of said first inverting amplifier and the output terminal of said second inverting amplifier, and said field effect transistor being turned off to provide a high impedance path between the input terminal of said first inverting amplifier and the output terminal of said second inverting amplifier in response to said second voltage appearing at the output terminal of said first inverting amplifier when said switch is closed.

2. A solid state binary logic signal source according to claim 1, in which said field effect transistor comprises an n-channel type metal oxide semiconductor field effect transistor.

3. A solid state binary logic signal source according to claim 1, in which said field effect transistor comprises a p-channel type metal oxide semiconductor field effect transistor.